United States Patent [19]
Hayashi

[11] Patent Number: 5,835,510
[45] Date of Patent: Nov. 10, 1998

[54] HIGH-SPEED VITERBI DECODER

[75] Inventor: Hideki Hayashi, Tsurugashima, Japan

[73] Assignee: Pioneer Electronic Corporation, Tokyo, Japan

[21] Appl. No.: 660,943

[22] Filed: Jun. 10, 1996

[30] Foreign Application Priority Data

Jun. 15, 1995 [JP] Japan .................................. 7-148908

[51] Int. Cl.$^6$ .................................................. G11B 20/18
[52] U.S. Cl. ........................................... 371/43.7; 360/39
[58] Field of Search .................. 371/43, 43.7; 375/341; 360/39

[56] References Cited

U.S. PATENT DOCUMENTS

| | | |
|---|---|---|
| 4,583,078 | 4/1986 | Shenoy et al. ............................ 341/51 |
| 5,650,988 | 7/1997 | Kuribayashi ............................. 369/59 |
| 5,651,032 | 7/1997 | Okita ...................................... 375/341 |

*Primary Examiner*—Stephen M. Baker
*Attorney, Agent, or Firm*—Finnegan, Henderson, Farabow, Garrett & Dunner, L.L.P.

[57] ABSTRACT

It is an object to provide a Viterbi decoder which can execute a high-speed decoding process. An error value between a sample value obtained by sampling a read signal read from a recording medium and each of prediction values is obtained as a branch metric value. One of the branch metric values and a first path metric value are added, thereby obtaining a first addition value. Another one of the branch metric values and a second path metric value are added, thereby obtaining a second addition value. The first and second path metric values are compared. On the basis of the comparison result, one of the first and second addition values is selected and used as a first path metric value.

7 Claims, 7 Drawing Sheets

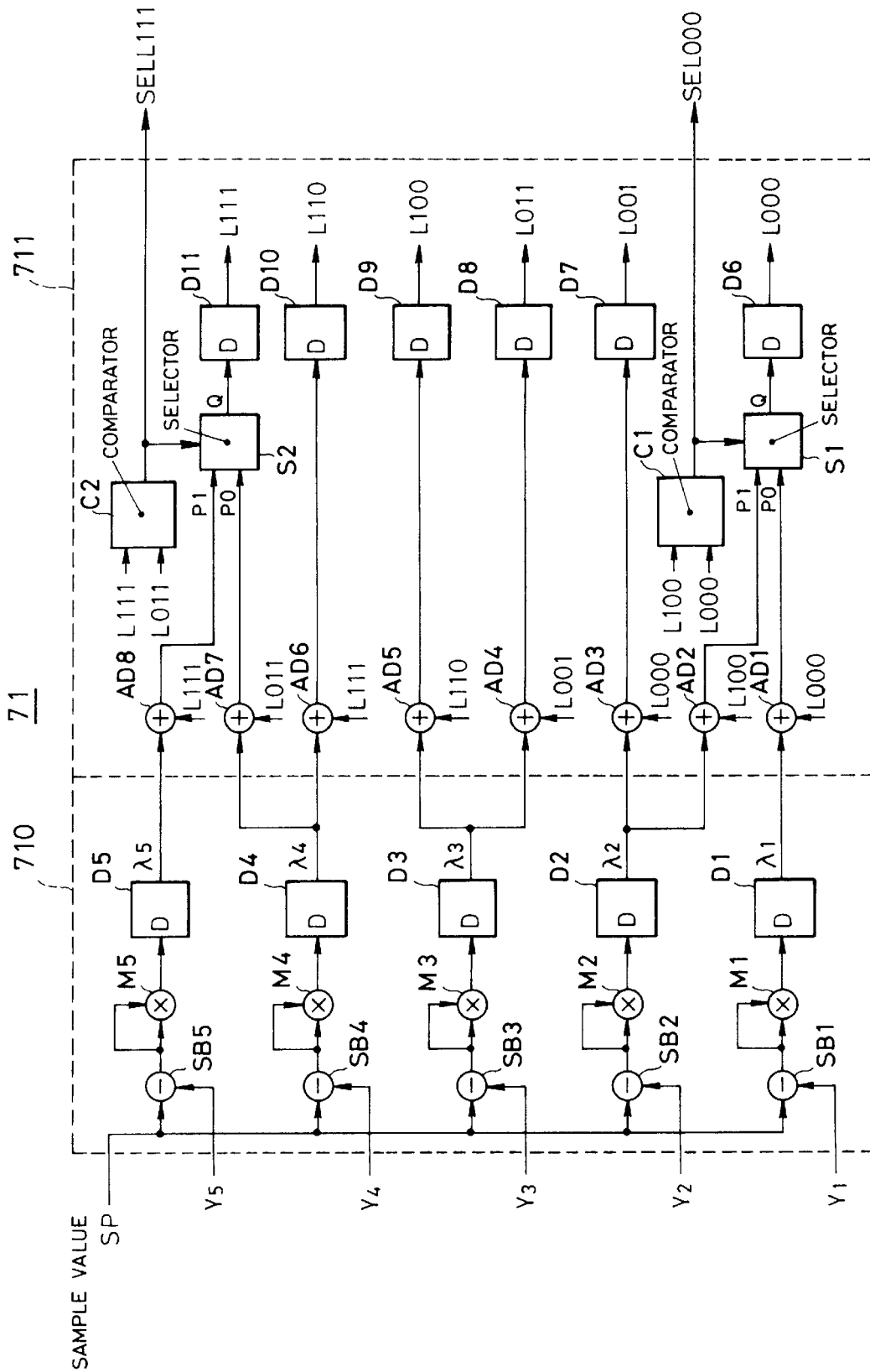

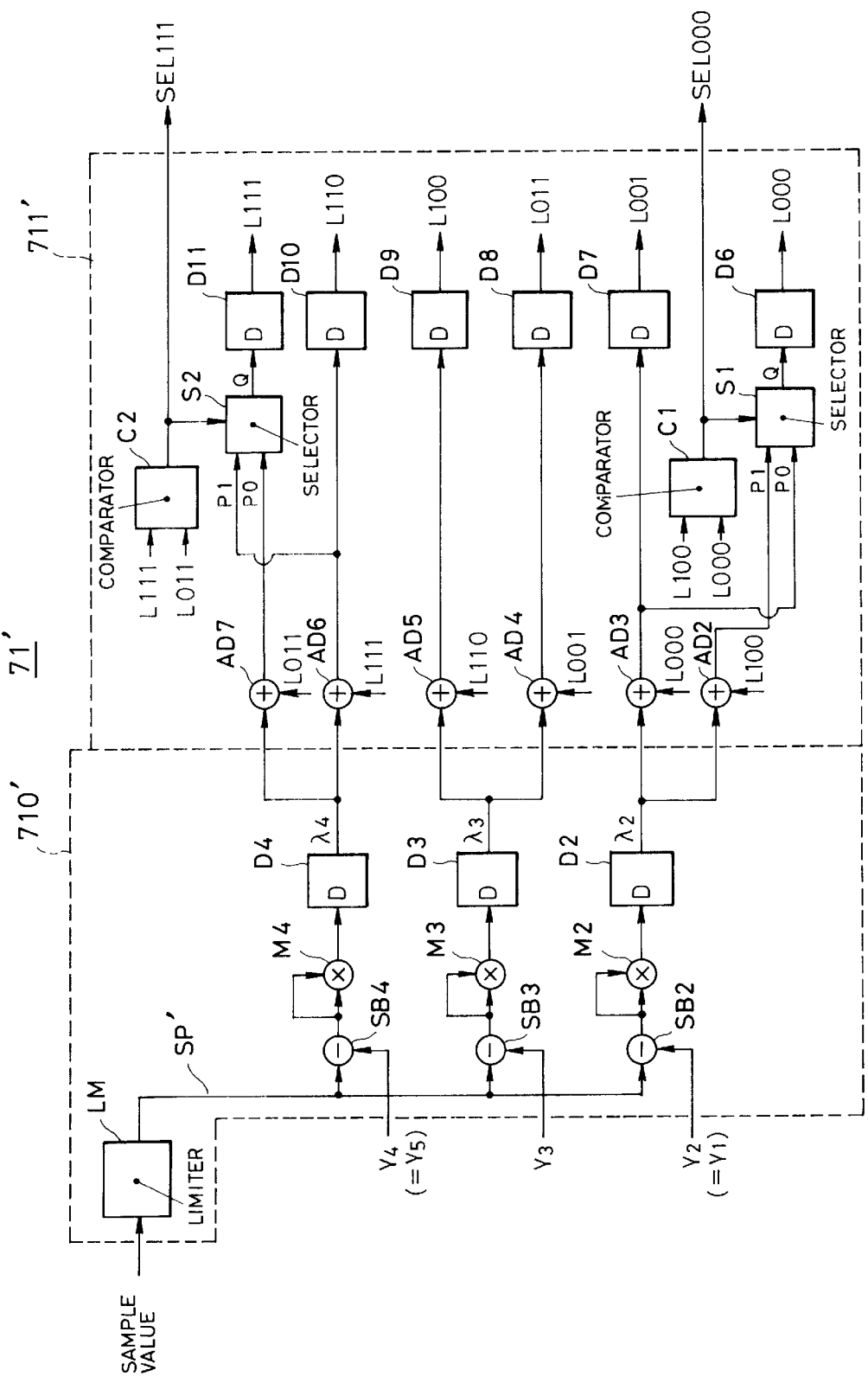

HIGH-SPEED VITERBI DECODER

BACKGROUND OF THE INVENTION

1. Field of the Invention

The present invention relates to a Viterbi decoder which is used in a recording information reproducing apparatus, a signal transmission system, or the like.

2. Description of the Related Background Art

As a method of decoding with a high reliability a digital data signal received via a transmission path, a Viterbi decoding method has been known.

FIG. 1 is a diagram showing a schematic construction of a Viterbi decoder.

As shown in FIG. 1, the Viterbi decoder is constructed by a metric unit 11 and a path memory 12.

FIG. 2 is a diagram showing an internal construction of the metric unit 11.

The metric unit 11 is constructed by a branch metric circuit 110 and a path metric circuit 111.

FIG. 2 shows the construction which is applied when the transmission path is of a PR (1, 3, 3, 1) partial response system and a digital data signal to be transmitted is the signal which was (2, 7) modulated.

In FIG. 2, each of subtracters SB1 to SB5 obtains a difference between a reception sample value SP and each of prediction values Y1 to Y5 as shown in FIG. 3 and supplies the difference to each of square circuits M1 to M5.

The square circuits M1 to M5 obtain square error values $\{Y1-SP\}^2, \{Y2-SP\}^2, \ldots,$ and $\{Y5-SP\}^2$, respectively. D registers D1 to D5 fetch the square error values at the same timing as the sampling timing and supply the square error values as branch metric values $\lambda 1$ to $\lambda 5$ to the path metric circuit 111, respectively.

An adder AD1 of the path metric circuit 111 supplies an addition result obtained by adding the branch metric value $\lambda 1$ and a path metric value L000 supplied from a D register D6, which will be described hereinlater, to a comparator C1 and a selector S1.

An adder AD2 supplies an addition result obtained by adding the branch metric value $\lambda 2$ and a path metric value L100 supplied from a D register D9, which will be described hereinafter, to the comparator C1 and selector S1.

The comparator C1 compares the addition results of the adders AD1 and AD2 and when (the addition result of the adder AD2)≧(the addition result of the adder AD1), a path selection signal SEL000 of the logic value "0" is generated and, when (the addition result of the adder AD2)<(the addition result of the adder AD1), the path selection signal SEL000 of the logic value "1" is generated.

The selector S1 selects a smaller one of the addition results of the adders AD1 and AD2 on the basis of the path selection signal SEL000 and supplies it to the D register D6. The D register D6 fetches the addition result supplied from the selector S1 at the same clock timing as the sampling timing and feeds back and supplies it as a path metric value L000 to the adder AD1 and an adder AD3, respectively.

The adder AD3 supplies an addition result obtained by adding the branch metric value $\lambda 2$ and the path metric value L000 supplied from the D register D6 to a D register D7. The D register D7 fetches the addition result sent from the adder AD3 at the same clock timing as the sampling timing and feeds back and supplies it as a path metric value L000 to an adder AD4. The adder AD4 supplies an addition result obtained by adding the branch metric value $\lambda 3$ and the path metric value L000 supplied from the D register D7 to a D register D8. The D register D8 fetches the addition result sent from the adder AD4 at the same clock timing as the sampling timing and feeds back and supplies as a path metric value L011 to an adder AD7. An adder AD5 supplies an addition result obtained by adding the branch metric value $\lambda 3$ and a path metric value L110 supplied from a D register D10, which will be described hereinlater, to the D register D9. The D register D9 fetches the addition result supplied from the adder AD5 at the same clock timing as the sampling timing and feeds back and supplies it as a path metric value L100 to the adder AD2. An adder AD6 supplies an addition result obtained by adding the branch metric value $\lambda 4$ and a path metric value L111 supplied from a D register D11, which will be described hereinafter, to the D register D10. The D register D10 fetches the addition result sent from the adder AD6 at the same clock timing as the sampling timing and feeds back and supplies it as a path metric value L110 to the adder AD5.

The adder AD7 supplies an addition result obtained by adding the branch metric value $\lambda 4$ and the path metric value L011 supplied from the D register D8 to each of a comparator C2 and a selector S2. An adder AD8 supplies an addition result obtained by adding the branch metric value $\lambda 5$ and the path metric value L111 supplied from the D register D11 to each of the comparator C2 and selector S2.

The comparator C2 compares the addition results of the adders AD7 and AD8 and when (the addition result of the adder AD8)≧(the addition result of the adder AD7), a path selection signal SEL111 of the logic value "0" is generated and, when (the addition result of the adder AD8)<(the addition result of the adder AD7), path selection signal SEL111 of the logic value "1" is generated.

The selector S2 selects a smaller one of the addition results of the adders AD7 and AD8 in accordance with the path selection signal SEL111 and supplies it to the D register D11. The D register D11 fetches the addition result supplied from the selector S2 at the same clock timing as the sampling timing and feeds back and supplies it as a path metric value L111 to each of the adders AD6 and AD8.

The path memory 12 shown in FIG. 1 reads out a data sequence (path) of a binary value corresponding to the signal logic value of each of the path selection signals SEL000 and SEL111 formed by the metric unit 11 and generates it as a decoding digital signal.

In the Viterbi decoder as mentioned above, the square error value between the reception sample value obtained by sampling the reception signal supplied via the signal transmission system and each of the prediction values is first obtained as a branch metric value. The branch metric values are accumulated and added by the adders AD1 to AD8 in the path metric circuit 111. The data sequence having the smallest accumulated addition value is generated as a decoding digital signal from the path memory 12.

In the Viterbi decoding, it is important to sequentially select the data sequence having the smallest accumulated addition value.

In the path metric circuit 111, therefore, the smaller accumulated addition value has been preliminarily selected by the selectors S1 and S2 and is fed back and supplied to the adders AD1, AD3, AD6, and AD8 as a value to be added at the next time.

With the above construction, however, it takes a long time, for example, until the processes of the adder AD8 the comparator C2 the selector S2 are finished after the D register D5 generated the branch metric value λ5. Since there is a processing time which is consumed by the adder AD8, comparator C2, and selector S2, the frequency of the sampling clock cannot be unconditionally raised, so that there is a problem such that a high-speed process is hindered.

SUMMARY OF THE INVENTION

The invention is made to solve the problems and an object of the invention is to provide a Viterbi decoder which can perform a high-speed decoding process.

According to the invention, there is provided a Viterbi decoder for decoding a digital data signal on the basis of a sample value obtained by sampling, at a predetermined sampling timing, a read signal read out from a recording medium in which the digital data signal has been recorded, comprising: branch metric means for obtaining an error value, as a branch metric value, between the sample value and each of a plurality of prediction values every prediction value; first adding means for obtaining a first addition value by adding one of the branch metric values and a first path metric value; second adding means for obtaining a second addition value by adding another one of the branch metric values and a second path metric value; comparing means for comparing the first and second path metric values; selecting means for selecting the addition value between the first and second addition values in accordance with the comparison result by the comparing means and for generating the selected addition value; means for fetching the selected output every predetermined sampling timing and for generating as a first path metric; and a path memory for reading out a data sequence of a binary value based on the comparison result and for generating as a decoding digital data signal.

The Viterbi decoder according to the invention first obtains the error value, as a branch metric value, between the sample value obtained by sampling the read signal read out from the recording medium and each of the plurality of prediction values. The first addition value is obtained by adding one of the branch metric values and the first path metric value and the second addition value is obtained by adding another one of the branch metric values and the second path metric value. The first and second path metric values are compared. On the basis of the comparison result, one of the first and second addition values is selected and is used as a first path metric value.

BRIEF DESCRIPTION OF THE DRAWINGS

Features of the invention will be made clear on the basis of the following detailed description of the invention with reference to the drawings.

FIG. 5 is a diagram showing an internal construction of a metric unit 71 in the Viterbi decoder 7 according to the invention;

FIG. 7 is a diagram showing another embodiment of the internal construction of the metric unit 71.

DETAILED DESCRIPTION OF THE PREFERRED EMBODIMENTS

Figure 4:
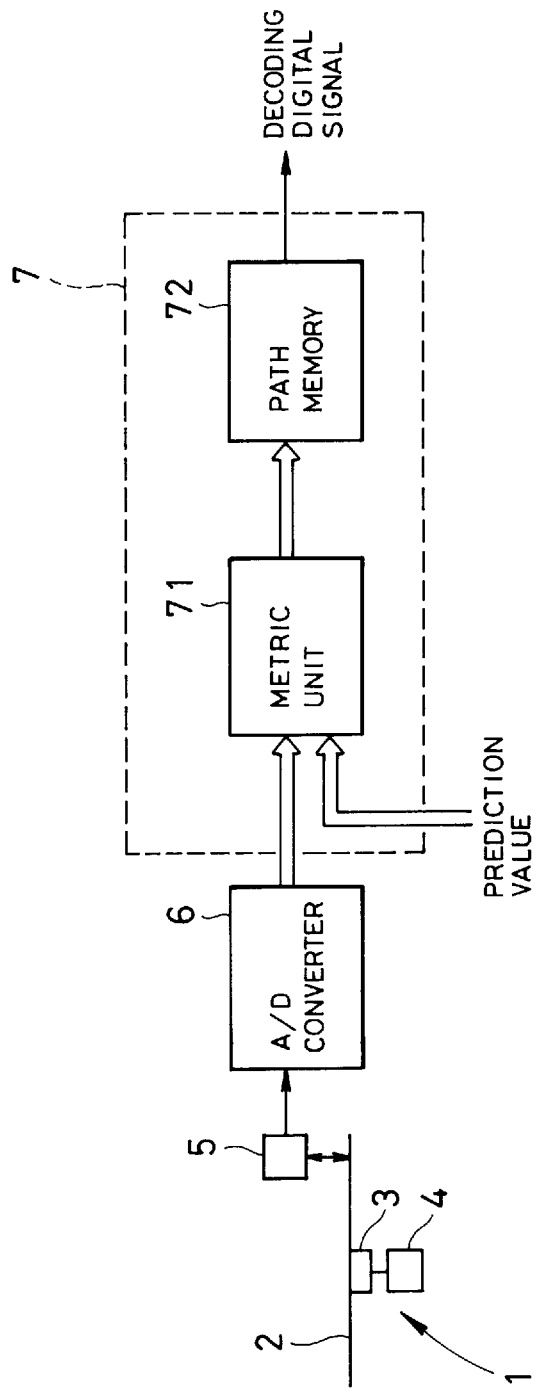
FIG. 4 is a diagram showing a schematic construction of a recording information reproducing apparatus having a Viterbi decoder 7 according to the invention.

FIG. 4 is a diagram showing a schematic construction of a recording information reproducing apparatus having a Viterbi decoder 7 according to the invention.

In FIG. 4, a reading apparatus 1 comprises: a turntable 3 for rotatably supporting an optical disc 2 as a recording medium; a rotation driving unit 4 for rotating the turntable 3 at a desired rotational speed; and a pickup 5 for irradiating a read beam onto a recording surface of the optical disc 2 and converting its reflected beam into an electric signal, thereby obtaining a read signal.

An A/D converter 6 samples the read signal supplied from the pickup 5 and sequentially supplies the sample value SP corresponding to a signal level of the read signal to the Viterbi decoder 7.

The sample value sequence is subjected to a Viterbi decoding process by the Viterbi decoder 7 comprising a metric unit 71 and a path memory 72 and is generated as a decoding digital signal.

FIG. 5 is a diagram showing an internal construction of the metric unit 71 in the Viterbi decoder according to the invention.

FIG. 5 is a diagram showing an example of a construction which is used when the reading apparatus 1 shown in FIG. 4 is of a PR (1, 3, 3, 1) partial response system and the recording signal recorded on the optical disc 2 is the signal which was RLL (2,7) modulated.

The metric unit 71 is constructed by a branch metric circuit 710 and a path metric circuit 711.

Figure 3:
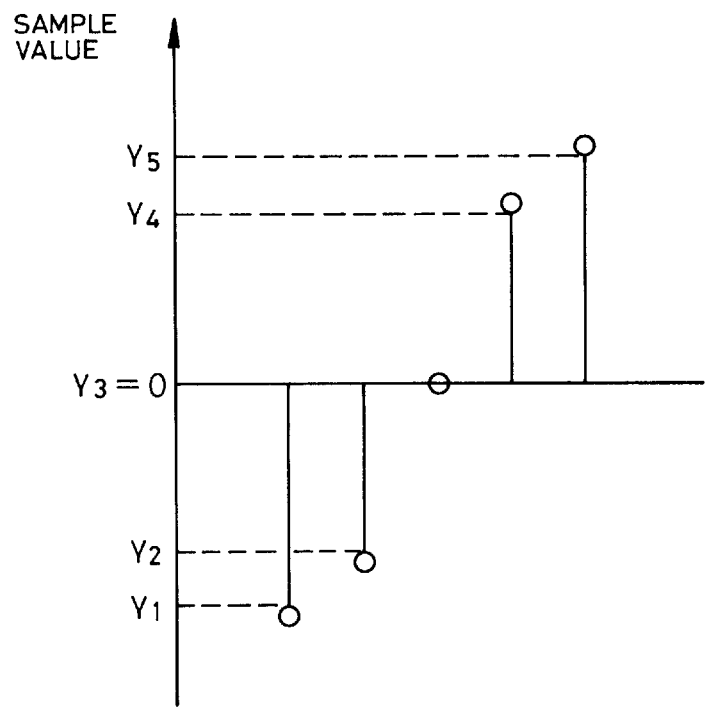
FIG. 3 is a diagram showing the prediction values Y1 to Y5.

In the above construction, as prediction values of the sample value SP which can be generated by the A/D converter 6 in an ideal state such that the partial response transmission system is not influenced by noises, five prediction values Y1 to Y5 as shown in FIG. 3 are assumed.

In FIG. 5, each of subtracters SB1 to SB5 obtains a difference between the sample value SP which is supplied from the A/D converter 6 and each of the prediction values Y1 to Y5 and supplies to each of the square circuits M1 to M5.

The square circuits M1 to M5 obtain square error values $\{Y1-SP\}^2$, $\{Y2-SP\}^2$, ..., and $\{Y5-SP\}^2$, respectively. D registers D1 to D5 fetch the square error values at the same clock timing as a sampling timing of the A/D converter 6 and supplies them as branch metric values λ1 to λ5 to a path metric circuit 711.

The adder AD1 of the path metric circuit 711 supplies an addition result obtained by adding the branch metric value λ1 and the path metric value L000 sent from the D register D6, which will be described hereinlater, to the selector S1. The adder AD2 supplies an addition result obtained by adding the branch metric value λ2 and the path metric value L100 sent from the D register D9, which will be described hereinafter, to the selector S1.

The comparator C1 compares the path metric values L100 and L000 and when (the path metric value L100≧path metric value L000), the path selection signal SEL000 of the logic value "0" is generated and, when (the path metric value L100)<(the path metric value L000),
the path selection signal SEL000 of the logic value "1", is generated.

When the path selection signal SEL000 is equal to "0", that is, when the path metric value L100 is equal to or larger than the path metric value L000, the selector S1 selects the addition result of the adder AD1 and supplies it to the D register D6. On the other hand, when the path metric selection signal SEL000 is equal to "1", that is, when the path metric value L100 is smaller than the path metric value L000, the selector S1 selects the addition result of the adder AD2 and supplies it to the D register D6. The D register D6 fetches the addition result sent from the selector S1 at the same clock timing as the sampling timing and feeds back and supplies as a path metric value L000 to each of the adders AD1 and AD3 and the comparator C1.

The adder AD3 supplies an addition result obtained by adding the branch metric value $\lambda 2$ and the path metric value L000 sent from the D register D6 to the D register D7. The D register D7 fetches the addition result sent from the adder AD3 at the same clock timing as the sampling timing and feeds back and supplies as a path metric value L000 to the adder AD4. The adder AD4 supplies an addition result obtained by adding the branch metric value $\lambda 3$ and the path metric value L000 sent from the D register D7 to the D register D8. The D register D8 fetches the addition result sent from the adder AD4 at the same clock timing as the sampling timing and feeds back and supplies as a path metric value L001 to each of the adder AD7 and comparator C2. The adder AD5 supplies an addition result obtained by adding the branch metric value $\lambda 3$ and the path metric value L110 sent from the D register D10, which will be described hereinlater, to the D register D9. The D register D9 fetches the addition result sent from the adder AD5 at the same clock timing as the sampling timing and feeds back and supplies as a path metric value L100 to each of the adder AD2 and comparator C1. The adder AD6 supplies an addition result obtained by adding the branch metric value $\lambda 4$ and the path metric value L111 sent from the D register D11, which will be described hereinafter, to the D register D10. The D register D10 fetches the addition result sent from the adder AD6 at the same clock timing as the sampling timing and feeds back and supplies as a path metric value L110 to the adder AD5.

The adder AD7 supplies an addition result obtained by adding the branch metric value $\lambda 4$ and the path metric value L011 sent from the D register D8 to the selector S2. The adder AD8 supplies an addition result obtained by adding the branch metric value $\lambda 5$ and the path metric value L111 sent from the D register D11 to the selector S2. The comparator C2 compares the path metric values L111 and L011. When (the path metric value L111)$\geq$(the path metric value L011), the path selection signal SEL111 is set to "0". On the other hand, when (the path metric value L111)<(the path metric value L011), the SEL111 is set to "1". When the path selection signal SEL111 is equal to "0", namely, when the path metric value L111 is equal to or larger than the path metric value L011, the selector S2 selects the addition result of the adder AD7 and supplies it to the D register D11. On the other hand, when the path selection signal SEL111 is equal to "1", namely, when the path metric value L111 is smaller than the path metric value L011, the selector S2 selects the addition result of the adder AD8 and supplies it to the D register D11.

The D register D11 fetches the addition result sent from the selector S2 at the same clock timing as the sampling timing and feeds back and supplies as a path metric value L111 to each of the adders AD6 and AD8 and the comparator C2.

In the metric unit 71 in the Viterbi decoder 7 as mentioned above, the square error values between the sample value SP and the prediction values Y1 to Y5 are first obtained as branch metric values $\lambda 1$ to $\lambda 5$. While the smallest accumulated addition value (path metric) is selected as a value to be added next by the path metric circuit 711, the accumulation and addition for every branch metric value are executed by the adders AD1 to AD8.

In this instance, the path metric circuit 711 uses the comparison result of the path metric values L111 and L001 and further, the comparison result of the path metric values L100 and L000 in order to select the smallest accumulated addition value.

That is, those accumulated addition values themselves are not compared in order to select the smallest accumulated addition value.

The construction shown in FIG. 5 is used in consideration of a fact that the prediction values Y1 and Y2 are close each other and the prediction values Y4 and Y5 are close each other as shown in FIG. 3 in the recording information reproducing apparatus in which the optical disc is used as a recording medium.

Figure 1:
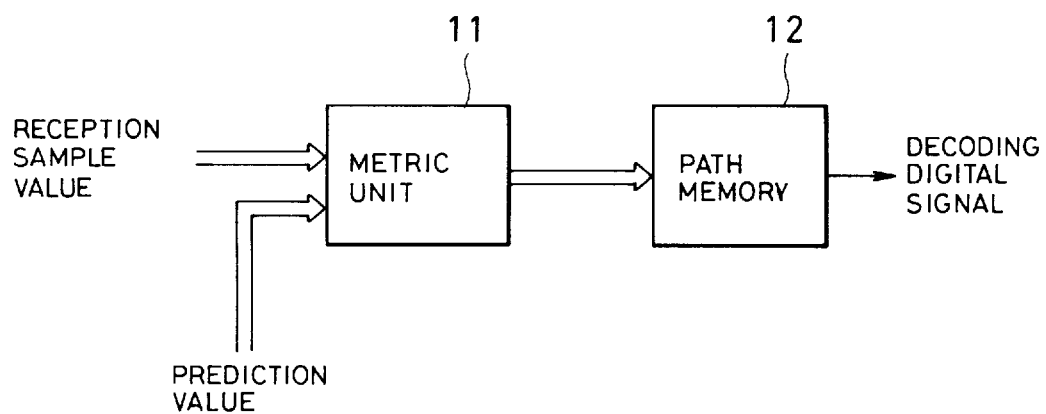
FIG. 1 is a diagram showing a schematic construction of a Viterbi decoder.
Figure 2:
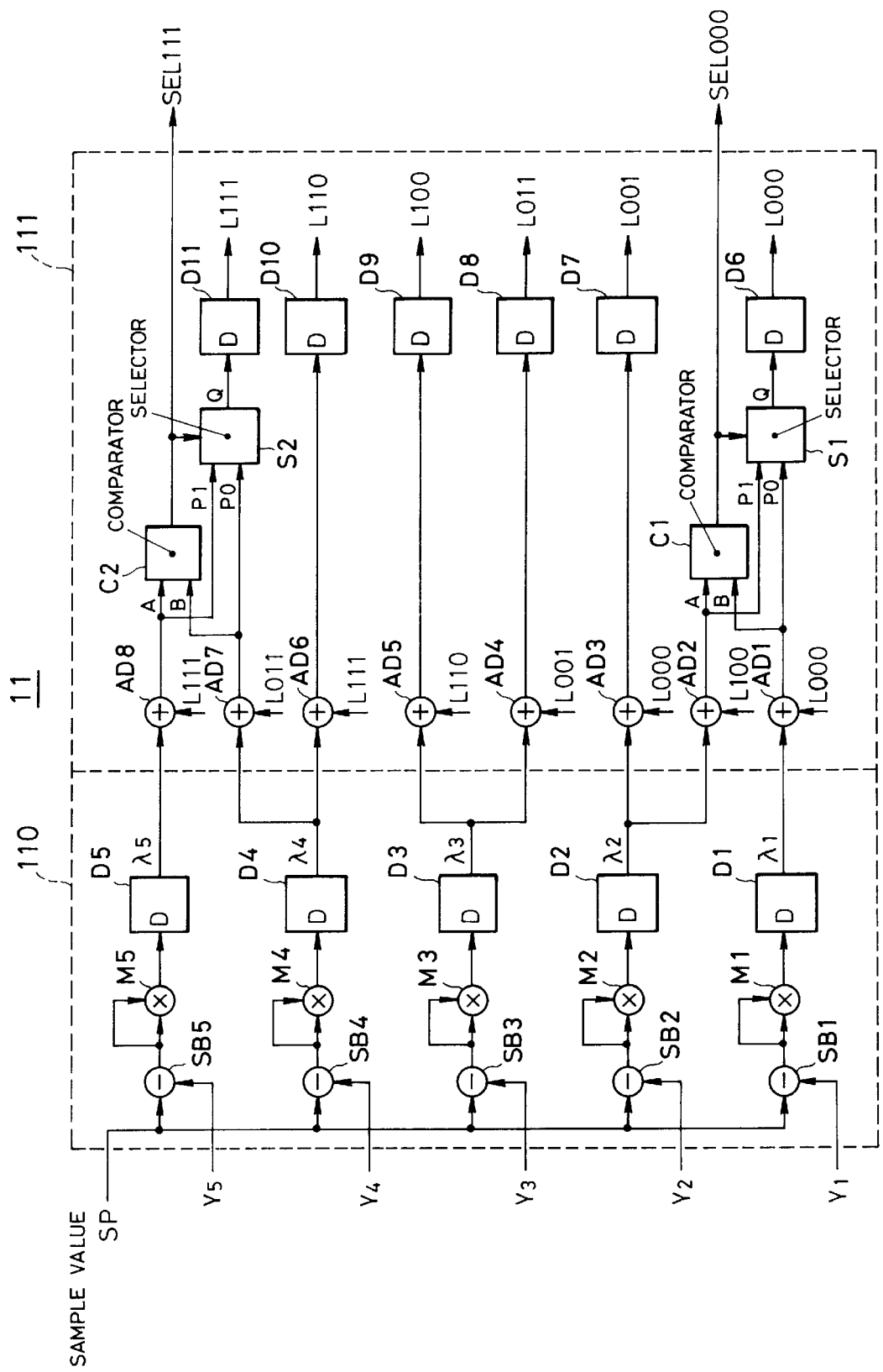
FIG. 2 is a diagram showing an internal construction of the metric unit 11.

For example, in the construction of FIG. 2 or 5,
the addition result of the adder AD8

$$= \lambda 5 + L111$$
$$= \{Y5 + SP\}^2 + L111$$

and
the addition result of the adder AD7

$$= \lambda 4 + L011$$
$$= \{Y4 + SP\}^2 + L011$$

When it is now assumed that the prediction values Y4 Y5 are relatively close, the comparison between the accumulated addition results of the adders AD7 and AD8 can be judged by comparing the path metric values L111 and L011.

According to the path metric circuit 711 having the construction as shown in FIG. 5, the accumulated addition values by the adders can be compared without waiting for a time that is consumed for the adding processes by the adders AD7 and AD8 (adders AD1 and AD2).

The processes can be, consequently, executed at a higher speed as compared with the construction of FIG. 2 in which the path is selected by comparing the accumulated addition values themselves.

In the recording information reproducing apparatus shown in FIG. 4, there is a case such that a phenomenon called "asymmetry" in which pit lengths of recording pits are asymmetric in association with a molding of the optical disc itself used as a recording medium or a change in conditions when information is recorded onto the optical disc occurs.

Figure 6A:
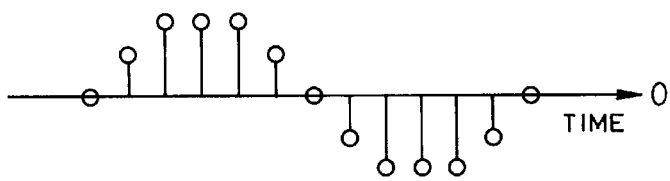
FIGS. 6A to 6C are diagrams showing an example of sample value sequences which are generated from an A/D converter 6.
Figure 6B:
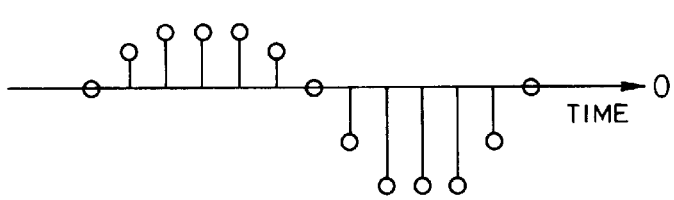

FIG. 6A is a diagram showing an example of a sample value sequence which is generated from the A/D converter 6 in FIG. 4 when no asymmetry occurs. FIG. 6B is a diagram showing an example of the sample value sequence which is generated from the A/D converter 6 in FIG. 4 when the asymmetry occurs.

As shown in FIG. 6B, when the asymmetry occurs, amplitudes of the sample values are asymmetric with respect to the vertical direction and the sample value is largely deviated from the prediction value. The decoding performance of the Viterbi decoder consequently deteriorates.

Figure 6C:
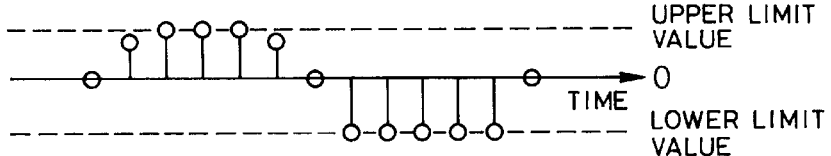

As shown in FIG. 6C, therefore, a method of limiting the upper and lower limit values of the A/D converted sample values to predetermined values, respectively, thereby forcedly eliminating the vertical asymmetry of the sample values is used.

FIG. 7 is a diagram showing an internal construction of a metric unit 71' according to another embodiment of the invention in which the level limitation of the sample value is applied to the metric unit 71.

In FIG. 7, an amplitude limitation sample value SP' such that the upper and lower limitation values of the sample value SP sent from the A/D converter 6 are limited to the same values as the prediction values Y4 and Y2, respectively, is supplied to one input of each of the subtracters SB2 to SB4 by a limiter LM. Each of the subtracters SB2 to SB4 obtains a difference between each of the prediction values Y2 to Y4 and the amplitude limitation sample value SP' and supplies the difference to each of the corresponding square circuits M2 to M4.

The square circuits M2 to M4 obtain the square error values $\{Y2-SP'\}^2$, $\{Y3-SP'\}^2$, and $\{Y4-SP'\}^2$, respectively.

The D registers D2 to D4 fetch the square error values at the same clock timing as the sampling timing of the A/D converter 6 and supply as branch metric values $\lambda 2$ to $\lambda 4$ to a path metric circuit 711'.

The adder AD2 in the path metric circuit 711' supplies an addition result obtained by adding the branch metric value $\lambda 2$ and the path metric value L100 sent from the D register D9 to the selector S1. The adder AD3 supplies an addition result obtained by adding the branch metric value $\lambda 2$ and the path metric value L000 sent from the D register D6 to each of the selector S1 and D register D7.

The comparator C1 compares the path metric values L100 and L000 and when (the path metric value L100)≧(the path metric value L000), the path selection signal SEL000 of the logic value "0" is generated and, when (the path metric value L100)<(the path metric value L000), the path selection signal SEL000 of the logic value "1" is generated.

When the path selection signal SEL000 is equal to "0", that is, when the path metric value L100 is equal to or larger than the path metric value L000, the selector S1 selects the addition result of the adder AD3 and supplies it to the D register D6. On the other hand, when the path selection signal SEL000 is equal to "1", that is, when the path metric value L100 is smaller than the path metric value L000, the selector S1 selects the addition result of the adder AD2 and supplies it to the D register D6.

The D register D6 fetches the addition result sent from the selector S1 at the same clock timing as the sampling timing and feeds back and supplies as a path metric value L000 to each of the adder AD3 and comparator C1.

The D register D7 fetches the addition result sent from the adder AD3 at the same clock timing as the sampling timing and feeds back and supplies it as a path metric value L001 to the adder AD4. The adder AD4 supplies an addition result obtained by adding the branch metric value $\lambda 3$ and the path metric value L001 sent from the D register D7 to the D register D8. The D register D8 fetches the addition result sent from the adder AD4 at the same clock timing as the sampling timing and feeds back and supplies it as a path metric value L011 to each of the adder AD7 and comparator C2. The adder AD5 supplies an addition result obtained by adding the branch metric value $\lambda 3$ and the path metric value L110 sent from the D register D10 to the D register D9. The D register D9 fetches the addition result sent from the adder AD5 at the same clock timing as the sampling timing and feeds back and supplies it as a path metric value L100 to each of the adder AD2 and comparator C1. The adder AD6 supplies an addition result obtained by adding the branch metric value $\lambda 4$ and the path metric value L111 sent from the D register D11, which will be described hereinlater, to each of the D register D10 and selector S2. The adder AD7 supplies an addition result obtained by adding the branch metric value $\lambda 4$ and the path metric value L011 sent from the D register D8 to the selector S2. The D register D10 fetches the addition result sent from the adder AD6 at the same clock timing as the clock timing and feeds back and supplies it as a path metric value L110 to the adder AD5. The Adder AD7 supplies an addition result obtained by adding the branch metric value $\lambda 4$ and the path metric value L011 sent from the D register D8 to the selector S2.

The comparator C2 compares the path metric values L111 and L011 and when (the path metric value L111)≧(the path metric value L011), the path selection signal SEL111 of the logic value "0" is generated and, when (the path metric value L111)<(the path metric value L011), the path selection signal SEL111 of the logic value "1" is generated.

When the path selection signal SEL111 is equal to "0", that is, when the path metric value L111 is equal to or larger than the path metric value L011, the selector S2 selects the addition result of the adder AD7 and supplies it to the D register D11. On the other hand, when the path selection signal SEL111 is equal to "1", that is, when the path metric value L111 is smaller than the path metric value L011, the selector S2 selects the addition result of the adder AD6 and supplies it to the D register D11. The D register D11 fetches the addition result sent from the selector S2 at the same clock timing as the sampling timing and feeds back and supplies it as a path metric value L111 to each of the adder AD6 and comparator C2.

As mentioned above, in the embodiment shown in FIG. 7, the Viterbi decoding is executed by using the amplitude limitation sample value obtained by limiting the amplitude of the sample value derived in correspondence to the read signal by the limiter LM. In the embodiment shown in FIG. 7, the prediction values Y1 and Y2 among the prediction values Y1 to Y5 are regarded as a same value and this value is set to a value which is equal to the lower limitation value of the limiter LM. Further, the prediction values Y4 and Y5 are regarded as a same value and this value is set to a value which is equal to the upper limitation value of the limiter LM.

In the above construction, for example, even if the asymmetry occurs and the sample value is largely deviated from the prediction value, since the amplitude limitation sample value SP' which is supplied to the subtracters SB2 to SB4 doesn't exceed the range of the prediction values Y2 to Y4, the deterioration of the performance of the Viterbi decoding can be suppressed.

As mentioned above, in the Viterbi decoder according to the invention, the error value between the sample value obtained by sampling the read signal read from the recording medium and each of the plurality of prediction values is first obtained as a branch metric. One ($\lambda 1$ or $\lambda 5$) of the branch metric values and the first path metric value (L000 or L111) are added (by the adder AD1 or AD8), thereby obtaining the first addition value and another one (λ2 or λ4) of the branch metric values and the second path metric value (L100 or L011) are added (by the adder AD2 or AD7), thereby obtaining the second addition value. Further, the first and second path metric values are compared (by the comparator C1 or C2). In the first and second addition values, the addition value corresponding to the comparison result is selected (by the selector S1 or S2) and is used as a first path metric value.

That is, in the Viterbi decoder according to the invention, by comparing the values (path metric values) to be added which are supplied to the adder, the addition results which are generated from the adder are compared.

The selecting process of the addition results can be executed without waiting for the time that is consumed for the adding process, so that the processes can be executed at a high speed.

Although the preferred embodiments of the invention have been described above, it will be understood by those skilled in the art that the modifications in form and details can be made therein without departing from the spirit and scope of the invention.

What is claimed is:

1. A high-speed Viterbi decoder for decoding a digital data signal on the basis of a sample value obtained by sampling, at a predetermined sampling timing, a signal read from a recording medium in which the digital data signal has been recorded, said decoder comprising:

branch metric means for determining an error value, as a branch metric value, between said sample value and each of a plurality of prediction values;

first adding means for determining a first addition value by adding one of said branch metric values to a first path metric value;

second adding means for determining a second addition value by adding another one of said branch metric values to a second path metric value;

comparing means for comparing said first path metric value and second path metric value and generating a comparison result;

selecting means for generating a selection output based on the selection of one of the first addition value and second addition value, in accordance with said comparison result;

first path metric generating means for retrieving said selection output at every said predetermined sampling timing and for generating said selection output as a first path metric value; and a path memory means for reading a data sequence of a binary value based on said comparison result and for generating said data sequence as said decoding digital data signal.

2. A high-speed Viterbi decoder according to claim 1, wherein when said first path metric value is greater than or equal to said second path metric value, said selecting means selects and generates said second addition value as said selection output and when said first path metric value is lesser than said second path metric value, said selecting means selects and generates said first addition value as said selection output.

3. A high-speed Viterbi decoder according to claim 1, wherein said branch metric means includes a limiter for limiting the upper limit value of said sample value and for limiting the lower limit value of said sample value.

4. A high-speed Viterbi decoder according to claim 3, wherein the maximum value among said prediction values is equal to said upper limit value and the minimum value among said prediction values is equal to said lower limit value.

5. A high-speed Viterbi decoding method for decoding a digital data signal on the basis of a sample value obtained by sampling, at a predetermined sampling timing, a signal read from a recording medium in which the digital data signal has been recorded, said decoding method comprising:

branch metric step for determining an error value, as a branch metric value, between said sample value and each of a plurality of prediction values;

first adding step for determining a first addition value by adding one of said branch metric values to a first path metric value;

second adding step for determining a second addition value by adding another one of said branch metric values to a second path metric value;

comparing step for comparing said first path metric value and second path metric value and generating a comparison result;

selecting step for generating a selection output based on the selection of one of the first addition value and second addition value, in accordance with said comparison result;

first path metric generating step for retrieving said selection output at every said predetermined sampling timing and for generating said selection output as a first path metric value; and a path memory reading step for reading a data sequence of a binary value based on said comparison result and for generating said data sequence as said decoding digital data signal.

6. A high-speed Viterbi decoding method according to claim 5, wherein selecting step selects and generates said second addition value as said selection output when comparing step indicates that said first path metric value is greater than or equal to said second path metric value, and selects and generates said first addition value as said selection output when comparing step indicates that said first path metric value is less than said second path metric value.

7. A high-speed Viterbi decoding method according to claim 5, wherein said branch metric step further includes a limiting step for limiting an upper limit value of said sample value and providing a maximum value of said prediction values and for limiting a lower limit value of said sample value and providing a minimum value of said prediction values.

* * * * *